(12) United States Patent
Jura et al.

(10) Patent No.: US 10,269,995 B2
(45) Date of Patent: *Apr. 23, 2019

(54) SCREEN PRINTING ELECTRICAL CONTACTS TO NANOSTRUCTURED AREAS

(71) Applicant: Advanced Silicon Group, Inc., Lincoln, MA (US)

(72) Inventors: Michael Jura, Santa Monica, CA (US); Marcie R. Black, Lincoln, MA (US); Jeffrey B. Miller, Brookline, MA (US); Joanne Yim, San Francisco, CA (US); Joanne Forziati, Everett, MA (US); Brian P. Murphy, Revere, MA (US); Richard Chleboski, Medway, MA (US)

(73) Assignee: Advanced Silicon Group, Inc., Lincoln, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,422

(22) Filed: Jun. 14, 2017

(65) Prior Publication Data

US 2017/0278988 A1 Sep. 28, 2017

Related U.S. Application Data

(63) Continuation of application No. 14/338,752, filed on Jul. 23, 2014, now Pat. No. 9,768,331, which is a
(Continued)

(51) Int. Cl.
*H01L 31/044* (2014.01)
*H01L 31/0236* (2006.01)
(Continued)

(52) U.S. Cl.
CPC ........ *H01L 31/02363* (2013.01); *B82Y 30/00* (2013.01); *H01L 31/02167* (2013.01);
(Continued)

(58) Field of Classification Search
CPC ........ H01L 31/00–31/078; Y02E 10/50–10/60
(Continued)

(56) References Cited

U.S. PATENT DOCUMENTS

| | | | |
|---|---|---|---|
| 5,034,068 A * | 7/1991 | Glenn | ............. H01L 31/022433 136/256 |
| 2006/0207647 A1 | 9/2006 | Tsakalakos et al. | |

(Continued)

FOREIGN PATENT DOCUMENTS

| | | |
|---|---|---|
| CN | 102227002 A | 10/2011 |
| WO | 2011029640 A2 | 3/2011 |

OTHER PUBLICATIONS

Koynov et al., "Black multi-crystalline silicon solar cells", Phys. Stat. Sol. (RRL), 1, No. 2, R53-R55 (2007).
(Continued)

*Primary Examiner* — Bach T Dinh
(74) *Attorney, Agent, or Firm* — Lando & Anastasi, LLP

(57) ABSTRACT

A process is provided for contacting a nanostructured surface. The process may include (a) providing a substrate having a nanostructured material on a surface, (b) passivating the surface on which the nanostructured material is located, (c) screen printing onto the nanostructured surface and (d) firing the screen printing ink at a high temperature. In some embodiments, the nanostructured material compromises silicon. In some embodiments, the nanostructured material includes silicon nanowires. In some embodiments, the nanowires are around 150 nm, 250 nm, or 400 nm in length. In some embodiments, the nanowires have a diameter range between about 30 nm and about 200 nm. In some embodiments, the nanowires are tapered such that the base is larger than the tip. In some embodiments, the nanowires are tapered at an angle of about 1 degree, about 3 degrees,
(Continued)

or about 10 degrees. In some embodiments, a high temperature can be approximately 700 C, 750 C, 800 C, or 850 C.

20 Claims, 4 Drawing Sheets

Related U.S. Application Data continuation of application No. PCT/US2013/025958, filed on Feb. 13, 2013.

(60) Provisional application No. 61/598,717, filed on Feb. 14, 2012.

(51) Int. Cl.
*B82Y 30/00* (2011.01)
*H01L 31/0224* (2006.01)
*H01L 31/0352* (2006.01)
*H01L 31/0216* (2014.01)
*H01L 31/0312* (2006.01)
*H01L 31/0368* (2006.01)
*H01L 31/0376* (2006.01)
*H01L 31/18* (2006.01)
*H01L 29/06* (2006.01)

(52) U.S. Cl.
CPC ............ *H01L 31/022425* (2013.01); *H01L 31/022433* (2013.01); *H01L 31/0312* (2013.01); *H01L 31/03682* (2013.01); *H01L 31/03762* (2013.01); *H01L 31/035227* (2013.01); *H01L 31/1868* (2013.01); *H01L 29/0673* (2013.01); *Y02E 10/50* (2013.01)

(58) Field of Classification Search
USPC .................................................. 136/243–265
See application file for complete search history.

(56) References Cited

U.S. PATENT DOCUMENTS

| | | |
|---|---|---|
| 2008/0006319 A1 | 1/2008 | Bettge et al. |
| 2009/0256134 A1 | 10/2009 | Buchine et al. |
| 2011/0114179 A1 | 5/2011 | Funakoshi |
| 2011/0136288 A1 | 6/2011 | Duane et al. |
| 2011/0155229 A1 | 6/2011 | Lam et al. |
| 2011/0277825 A1 | 11/2011 | Fu et al. |
| 2013/0099345 A1 | 4/2013 | Black et al. |

OTHER PUBLICATIONS

Koynov et al., "Black nonreflecting silicon surfaces for solar cells", Applied Physics Letters, 88, 203107 (2006).
Tobias et al., "Crystalline silicon solar cells and modules," A. Luque, Handbook of Photovoltaic Science and Engineering, 2003, chapter 7.
Kang et al., "Size and temperature effects on the fracture mechanisms of silicon nanowires: Molecular dynamics simulations," International Journal of Plasticity, 26, 2010, 1387-1401.
Gozen et al., "A Rotating-Tip-Based Mechanical Nano-Manufacturing Process: Nanomilling," Nanoscale Research Letters, 5, 2010, 1403-1407.
Hilali et al., "A Review and Understanding of Screen-Printed Contacts and Selective-Emitter Formation," 14th Workshop on Crystalline Silicon Solar Cells and Modules, Winter Park, Colorado, Aug. 8-11, 2004.
Neuhaus et al., Advances in OptoElectronics, vol. 2007, Article ID 24521.
International Search Report for WO 2013/123066.

\* cited by examiner

SCREEN PRINTING ELECTRICAL CONTACTS TO NANOSTRUCTURED AREAS

CROSS-REFERENCE TO RELATED APPLICATIONS

This application claims priority under 35 U.S.C. § 120 as a continuation of U.S. patent application Ser. No. 14/338,752, titled "SCREEN PRINTING ELECTRICAL CONTACTS TO NANOWIRE AREAS," filed Jul. 23, 2014, which in turn claims priority as a continuation of international application PCT/US2013/025958, filed Feb. 13, 2013, which claims priority to U.S. provisional patent application No. 61/598,717 filed Feb. 14, 2012. These applications are each incorporated by reference in their entirety.

BACKGROUND OF THE INVENTION

Nanowire arrays are seeing increasing use in a variety of applications. See, e.g., U.S. Pat. No. 8,143,143, "Process for Fabricating Nanowire Arrays," issued Mar. 27, 2012. An exemplary silicon nanowire array may include a collection of silicon nanowires, on the order of 100 nm in diameter, on the order of several micrometers in height, and of approximately cylindrical or frustoconical shape. The axes of the nanowires run approximately parallel to each other. Each is attached at an end to a silicon substrate and is very roughly perpendicular to that substrate.

A process for fabricating nanowire arrays is described in U.S. Pat. No. 8,143,143. In this process, one deposits nanoparticles and a metal film onto the substrate in such a way that the metal is present and touches silicon where etching is desired, and is blocked from touching silicon or not present elsewhere. One submerges the metallized substrate into an etchant aqueous solution comprising hydrofluoric acid (HF) and an oxidizing agent. In this way, arrays of nanowires with controlled diameter and length are produced.

Relevant information regarding silicon fabrication processes known to those of skill in the art can be found, for example, in Sami Franssila. *Introduction Microfabrication* (John Wiley & Sons 2004), and the references cited therein.

A silicon nanowire array can reduce the reflectivity of a solar cell surface. Other types of nanostructuring can also achieve this effect.

A silicon nanowire array on top of a silicon substrate, can alter the opto-electrical properties of the bulk silicon substrate. For example, a silicon nanowire array reduces the reflection of the silicon substrate, reduces the reflection at off-angles of incidence, and increases the absorption of the silicon in ways similar to traditional pyramids or light trapping mechanisms used in solar cells.

Some of the altered optical-electrical properties of silicon nanowires compared to bulk silicon are beneficial for solar cells. However, in order to form a solar cell, the two sides of a p-n junction need to be connected to the outside world. Unfortunately, contacting nanowires is not always easy.

One device design for nanowire solar cells places vertically aligned nanowires on top of a bulk (non-nanostructured) substrate. In this design, the back contact can be made from the backside of the substrate. The front contact, however, is more difficult to make.

For the types of solar cells currently manufactured, not using nanowire arrays, it is common to make contacts by screen printing. Screen printing is robust, has a high throughput, and is low-cost. The front and back contacts of a solar cell are typically formed in separate steps. For most cell designs, silver is applied to the front, and aluminum to the back. For the front, paste is squeezed through a stainless steel or polyester fine metal mesh screen with an adjustable and finely controlled force delivered through metal or polymer squeegee. The screen defines a comb-like (finger line array and crossed bus bars) pattern designed to provide sufficient conductivity while minimizing optical shading from the metal lines. The paste is then dried at temperatures of 100-200 C to drive off organic solvents and fired at around 800 C to diffuse in the metal to establish a low contact resistance junction. For the back, an aluminum based paste is screen printed on the rear surface, establishing electrical contact and functioning as a back surface field. The aluminum is applied as a paste squeezed through a fine mesh screen, then fired at high temperatures to drive off organic solvents and diffuse in the aluminum to establish a low contact resistance junction. Although a continuous contact will result in lower resistance, commercial wafers utilize a back contact with an embedded mesh structure to reduce paste usage and minimize wafer warping during the subsequent high temperature processing steps. The pattern is defined in the screen by photolithography, although laser cut metal stencils may be utilized for smaller line widths. Automatic screen printers are available that are capable of in-line, continuous operation with high throughput. These machines accept wafers from packs, cassettes or a belt line, place them with sufficient accuracy under the screen and deliver the printed wafers to the belt line. Detailed methods for screen printing are described in reference (1).

One of ordinary skill in the art would expect that screen printing on nanowires would be difficult. For one, the nanowires may break or bend when the squeegee is moved across the surface of the cell to remove excess screen printing paste. In addition, one of ordinary skill in the art may not expect the nanowires to survive the high temperature fire required to drive off the organic materials in the pastes. Although the present assignee and others have contacted nanowire arrays with other processes such as electrochemical deposition (6) and sputtering, screen printing is the dominate process in solar cell manufacturing and is cost-effective. Hence developing a nanowire array that can be contacted via screen printing is of commercial importance.

SUMMARY OF THE INVENTION

A process is provided for contacting a nanostructured surface. In that process, a substrate is provided having a nanostructured material on a surface. A conductor is applied to the nanostructured surface with screen printing.

In one aspect, the present disclosure relates to a process including: (a) providing a substrate leaving a nanostructured material on a surface, (b) screen printing onto the nanostructured surface and (c) firing the screen printing ink at a high temperature. In some embodiments, the nanostructured material compromises silicon. In some embodiments, the nanostructured material includes silicon nanowires. In some embodiments, the nanowires are around 150 nm, 250 nm, or 400 nm in length. In some embodiments, the nanowires have a diameter range between about 30 nm and about 200 nm. In some embodiments, the nanowires are tapered such that the base is larger than the tip. In some embodiments, the nanowires are tapered at an angle of about 1 degree, about 3 degrees, or about 10 degrees. In some embodiments, a high temperature can be approximately 700 C, 750 C, 800 C, or 850 C.

Another aspect of the present disclosure relates to a silicon nanostructured p-n junction. with screen printed contacts contacting the nanostructured side. In some embodiments, the p-n junction can be used as a solar cell. In some embodiments, the nanostructured side includes a nanowire array. In some embodiments, both sides of the substrate have nanowires and both sides are contacted through screen printing. In some embodiments, the junction is below the nanowire array. In some embodiments, the nanowire array is coated with a passivating layer. in some embodiments, the passivating layer surrounding the nanowire includes aluminum oxide. In some embodiments, the passivating layer surrounding the nanowire is silicon dioxide. In some embodiments, the passivating layer surrounding the nanowire can be silicon nitride.

Another aspect of the present disclosure relates to a silicon nanowire array passivated with silicon nitride. In some embodiments, the silicon nitride can be deposited using plasma enhanced CVD (PECVD).

DETAILED DESCRIPTION OF THE INVENTION

Figure 1:
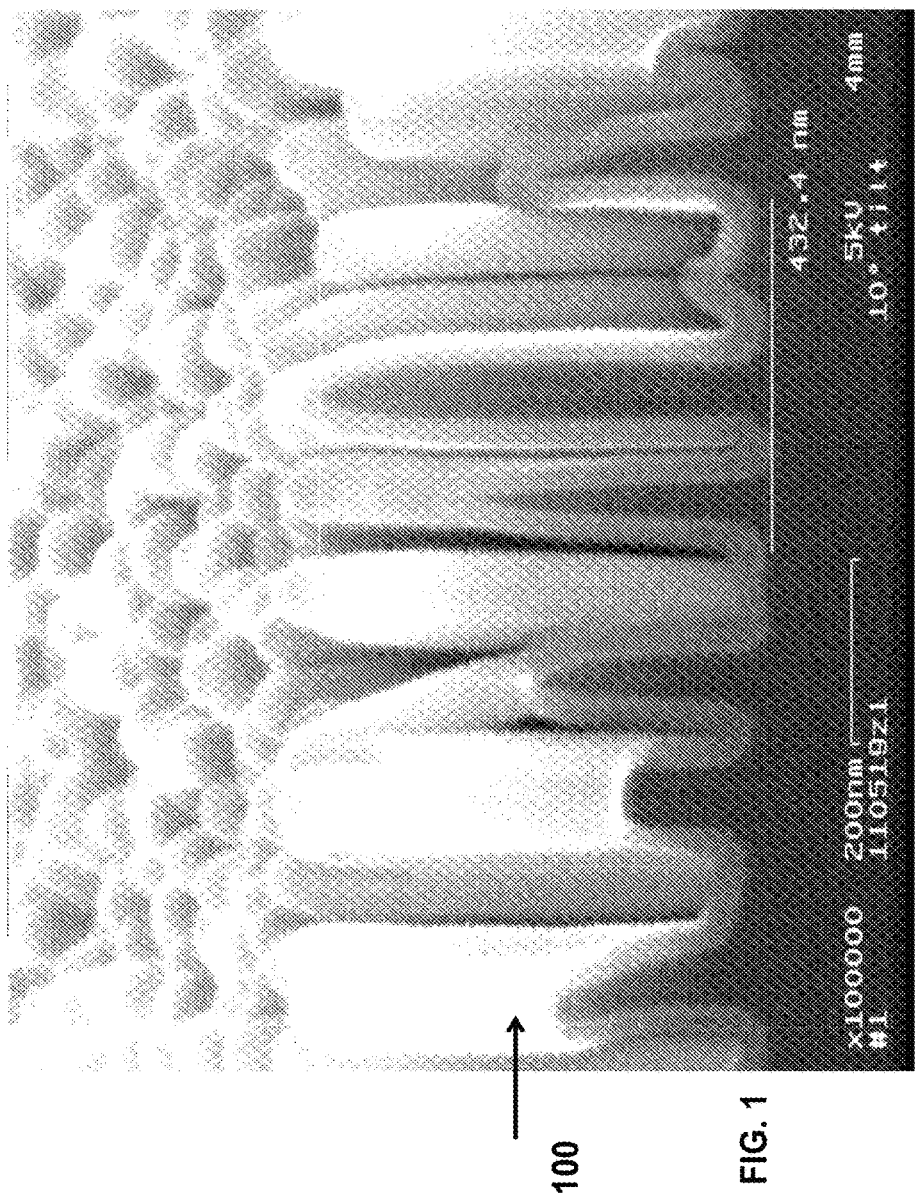
FIG. 1 depicts an edge view scanning electron micrograph of silicon nanowires coated with alumina.

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

In this process, a substrate is provided having a nanostructured material on a surface. The substrate is then subjected to standard screen printing processes. Screen printing is where screen printing ink (or paste) is squeezed through a stainless steel or polyester fine metal mesh screen with an adjustable and finely controlled force delivered through metal or polymer squeegee. The screen defines a comb-like (finger line array and crossed bus bars) pattern designed to provide sufficient conductivity while minimizing optical shading from the metal lines. The paste is then dried at temperatures of 100-200 C to drive off organic solvents and fired at around 800 C to diffuse in the metal to establish a low contact resistance junction.

Without wishing to be bound by theory, it is believed that the geometry of the described nanowire arrays permit screen printing with a standard screen printing process, directly onto the nanowire array. In particular, relatively short nanowires are desired for sufficient anti-reflection and scattering properties. The described nanowires used in the described solar cells are in the range of 150-450 nm in length, in some embodiments about 250 nm in length, compared to other nanowire arrays reported in the literature where the nanowire arrays are over a micron and often several microns. Furthermore, the disclosed nanowire arrays are dense. Roughly one third to one half of the volume of the nanowire array is silicon with the remaining volume being a passivation layer and air. The density of the nanowire array and the shorter wires improve the structural integrity of the nanowires during the mechanical and thermal stresses of the screen printing process.

In one aspect of the present disclosure, the substrate and nanostructures are comprised of materials other than silicon. Numerous methods of creating nanostructures on the substrate are contemplated including vapor liquid solid processes, laser chemical vapor deposition, reactive ion etching, and metal enhanced etching.

A variety of materials maybe deposited according to methods of the present disclosure depending on the device which is being manufactured. The current disclosure is not meant to be limited to use with certain materials. Some thin film device components which may be deposited with the described processes include metal electrodes for solar cells, interconnects and bus bars for solar cells, and electrodes for sensors, thin film batteries, and transistors.

In a further aspect of the present disclosure, an optoelectronic device is provided. The optoelectronic device includes (a) a substrate, (b) a nanostructured area on a first surface of the substrate, (c) an optional insulating layer atop the first surface, and (f) a conductor atop the optional insulating layer and nanostructured area, where the conductor was applied by screen printing. The conductor may be, for example, in the form of a grid, and consist of silver, aluminum, copper, or alloys including these metals.

Exemplary Process 1

Figure 2:
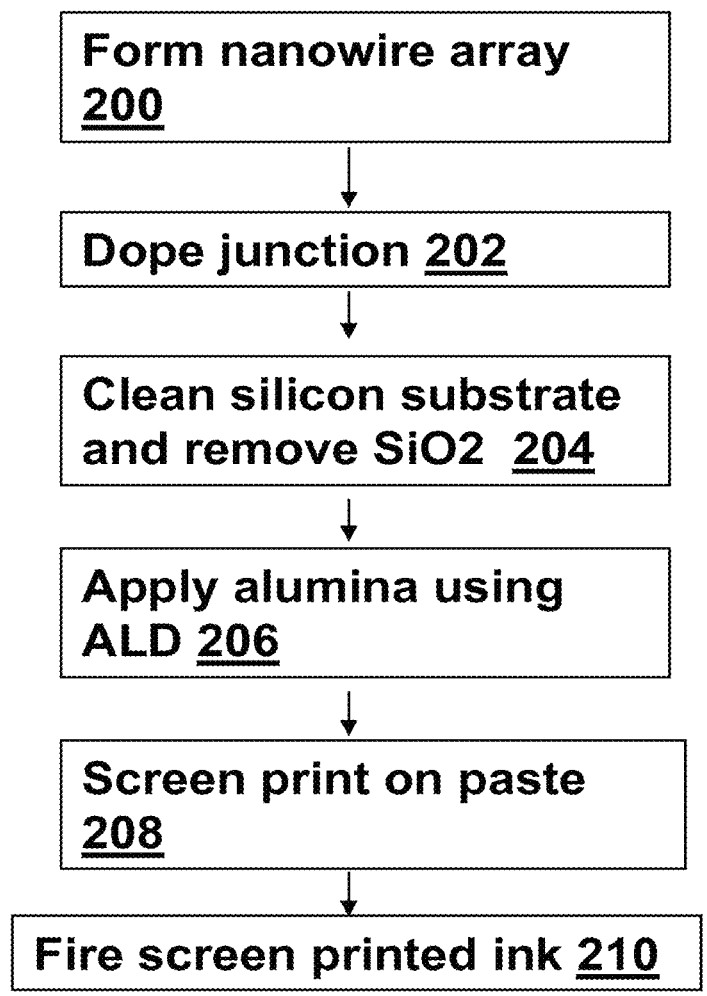
FIG. 2 depicts an example of a process flow for forming screen printed nanowire solar cells on alumina coated nanowires from exemplary process 1.

An exemplary process of this embodiment is summarized in FIG. 2. N-type material with a resistivity of 1 ohm-cm is selected having a surface with a (100) crystallographic orientation.

The first step is to form a nanowire array (step 200). The formation of nanowire in Exemplary Process 1 is as follows: the first step is to deposit 50-170 Å of silver which will be used for metal enhanced etching. The wafer is loaded into a sputtering chamber and silver is sputtered at a rate of 2-4 Å/s, a base pressure of <1e−6 Torr, and an argon pressure of 2e−3 Torr. The properties of the silver film as controlled by deposition rate, pressure, and thickness control the nanowire diameter, density, and taper.

The next step is the nanowire formation in an oxygen/HF bath. After the sample is removed from the sputtering chamber, it is placed in a dilute hydrofluoric acid (HF) bath. The bath contains 10 parts volume water to 1 part volume HF. The sample is etched in the HF bath for 10 minutes during which time oxygen is bubbled vigorously through the HF using a perforated plastic tube. The longer the sample is left in the bath, the longer the nanowires. For effective screen printing we hypothesis that the nanowires should be between 150 and 750 nm in length, this corresponds to an etch time between approximately 3 minutes and 20 minutes.

The concentration of the HF as well as the amount of oxygen present is one way to taper the nanowire. A slower etch will allow some vertical etching of the silicon and will lead to nanowire arrays with a slight taper, i.e. the nanowire has a larger diameter at its base than at the top of the nanowire. Generally, the nanowires have a diameter of about 30 nm to about 200 nm. The tapering of the nanowires can be about 1 to about 10 degrees, for example, about one degree, about three degrees or about 10 degrees.

Afterwards, the sample is rinsed three times in deionized water (DI).

The silver is then removed and the sample is cleaned in a series of wet baths. The first bath is a piranha clean which consists of 4 ml of sulfuric acid ($H_2SO_4$) to 1 ml of 30 wt % hydrogen peroxide ($H_2O_2$) at 70 C. Prior to placing the wafer into the piranha, it is stirred for 2 minutes. The stirring is then commenced and the wafer is submerged for 15 minutes. After the piranha etch, the wafer is cleaned 3 times with DI water.

The sample is then placed in dilute HF for 30 seconds. This HF solution has a volume ratio of 24:1 of water to 49% HF and is at room temperature. The wafer is then rinsed three times with DI water.

Next, a traditional 10 minute SC1 clean is done. This is a bath of 5:1:1 volume ratio of water, 30 wt % ammonium hydroxide (NH4OH), and 30 wt % hydrogen peroxide and is at 70 C. Again the wafer is rinsed three times in DI water.

After the SC1 clean an SC2 clean is performed on the wafer. This clean is a 10 minute soak at 70 C in 5:1:1 volume ratio of water, 37 wt % hydrochloric acid (HCl), 30 wt % hydrogen peroxide. The sample is then rinsed three times in DI water. Once these steps are complete, a nanowire array has been formed.

The next step of the method described in FIG. 2. is to dope the samples, i.e., to dope the junction on the sample (step 202). For this doping process we will first place dopants onto two source wafers. One source wafer will dope the front nanowire side of the wafer and will have boron doping. The other source wafer will have phosphorus and will dope the back side of the sample wafer. The source wafers will be used to dope the sample wafer.

In order to prepare the two source wafers, they are first cleaned with the piranha, HF, SC1, and SC2 cleans as described above.

Boron is spun onto one source wafer using the boron film spin-on diffusant B-153 (Filmtronics, Inc., Butler, Pa.). The dopant is spun on using a 5 second prespin at 500 RPM and then a 15 second spin at 5000 RPM.

A small dime size spot of Fiimtronics, Inc. (Butler, Pa.) phosphorus film spin-on diffusant P-506 is dropped onto the second source wafer. Both source wafers are then baked at 250 C on a hot plate for 10 minutes.

Next the stack of wafers used to dope the sample wafer is formed. The boron source wafer boron is placed boron side up on a quartz disc. Then three 525 micron thick spacers of silicon are placed on the edges of the wafer. The sample wafer is then placed nanowire side down on the boron source wafer, three more spacers are placed on the edges of the wafer, and the final source wafer (the phosphorus-doped source wafer) is placed phosphorus side down facing the non-nanowire side of the sample wafer.

The full stack including the two source wafers, spacers, and sample wafer are then pushed into a furnace tube with argon flowing at 2000 standard cubic centimeters per minute (SCCM) from room temperature to 1050 C in 1 minute 30 seconds. The furnace is then held at a flow rate of argon of 2000 SCCM and a temperature of 1050 C for 5 minutes, at which point 500 SCCMS of oxygen is added to the flow and the temperature is ramped down at 6 degrees per minute, for 15 minutes. After 15 minutes, the oxygen is switched off while the argon is left on and the furnace is allowed to cool to 745 C. The stack is then pulled out and cooled to room temperature in atmosphere. The sample wafer is removed from the stack.

The next step is the back contact. The sample wafer is first cleaned in a 10 minute HF dip with 4 ml of water to 1 ml of HF and rinsed three times, step 204 in FIG. 2.

The next step of the method disclosed in FIG. 2 (step 206) is to place alumina passivation via atomic layer deposition (AID) on the nanowire array, which provides electrical passivation on the nanowire arrays. The samples are placed inside the ALD chamber. The ALD system may be, for example, a Cambridge Nanotech Savannah 5200 (Cambridge, Mass.). The AID chamber is preheated to 250 C prior to loading our samples. After the samples are loaded, the chamber is pumped with a rough pump while a constant flow of $N_2$ at 20 SCCMs is introduced into the chamber. The pressure is around 2200 mTorr with this process. The program is set to make the process wait until the heaters are at 250 C. Once the temperature is at 250 C, the program waits another 60 seconds and pulses water, and then with trimethylaluminum (TMA). An automatic pulse control program is executed alternating between water and TMA for a total of 275 cycles.

FIG. 1 depicts an edge view scanning electron micrograph of silicon nano wires coated with alumina. The cleaved edge, labeled 100 in FIG. 1, illustrates the alumina coating.

The next step (step 208) is screen printing the front and back contacts with the paste. One skilled in the art of screen printing will be able to optimize the screen printing ink and deposition process. Next the front and back contacts are fired (step 210) using conditions know by those skilled in the art of screen printing. Peak temperatures generally are around 700-900 C. Firing with the proper conditions and a proper ramp profile ensures good contact resistance, good sheet resistance, and low junction leakage. Exemplary on screen printing conditions are Exemplary Process 2

A variation on the previously described process is to screen print prior to alumina passivation and then apply alumina passivation after the screen printed contacts are applied.

Exemplary Process 3

Figure 3:
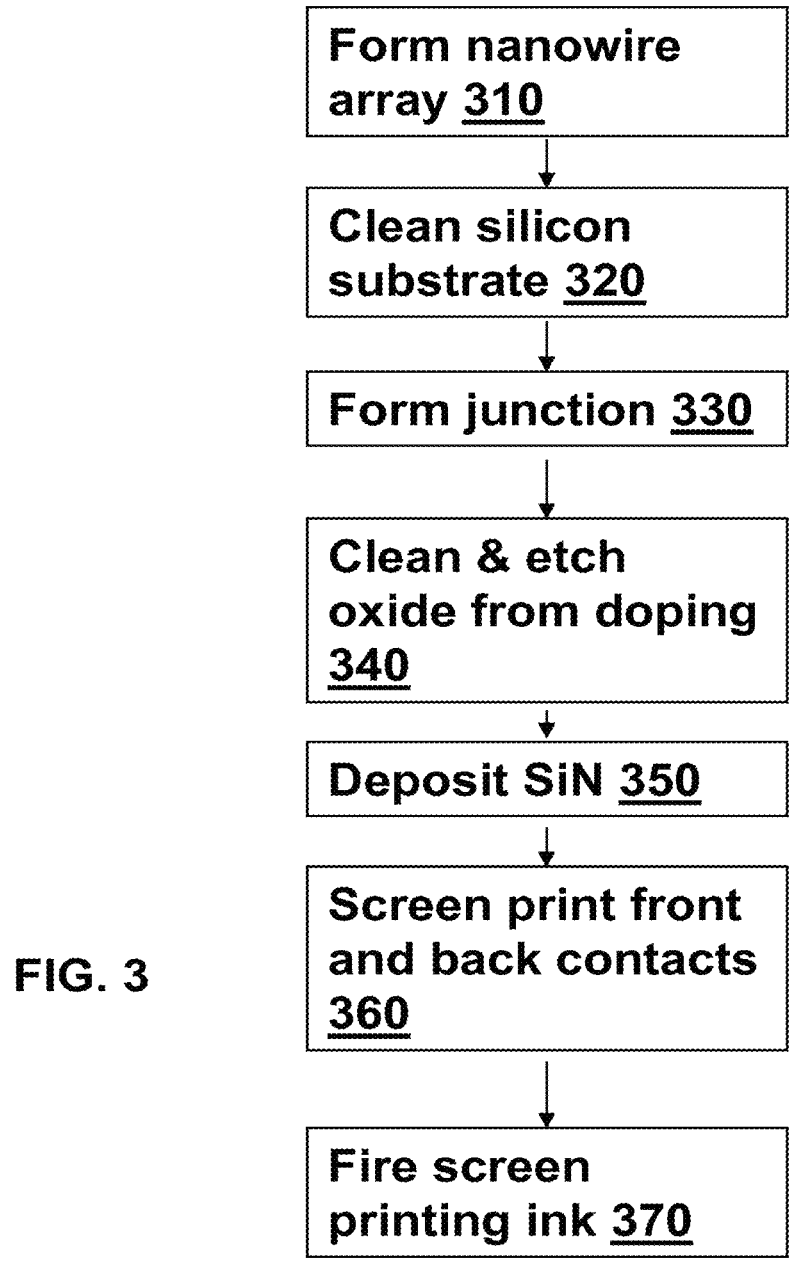
FIG. 3 depicts an alternative example of a process flow for forming screen printed nanowire solar cells where a plasma enhanced chemical vapor deposition (PECVD)-silicon nitride passivation layer covers the nanowire array prior to screen printing, from exemplary process 3.

An alternative to the preceding processes is to form nanowire array and then deposit plasma enhanced chemical vapor deposition (PECVD) silicon nitride (SiN), as shown in FIG. 3. In this flow, the nanowires are formed (step 310), the sample is cleaned (step 320), the junction is formed (step 330), and the sample is then cleaned and the oxide is etched (340). All of these steps are identical to the previous example. However, the next step is to deposit SiN (step 350). This is the passivation material used in traditional processing, and therefore the identical screen printing ink deposition (step 360) and firing (step 370) as discussed above can be used.

Figure 4:
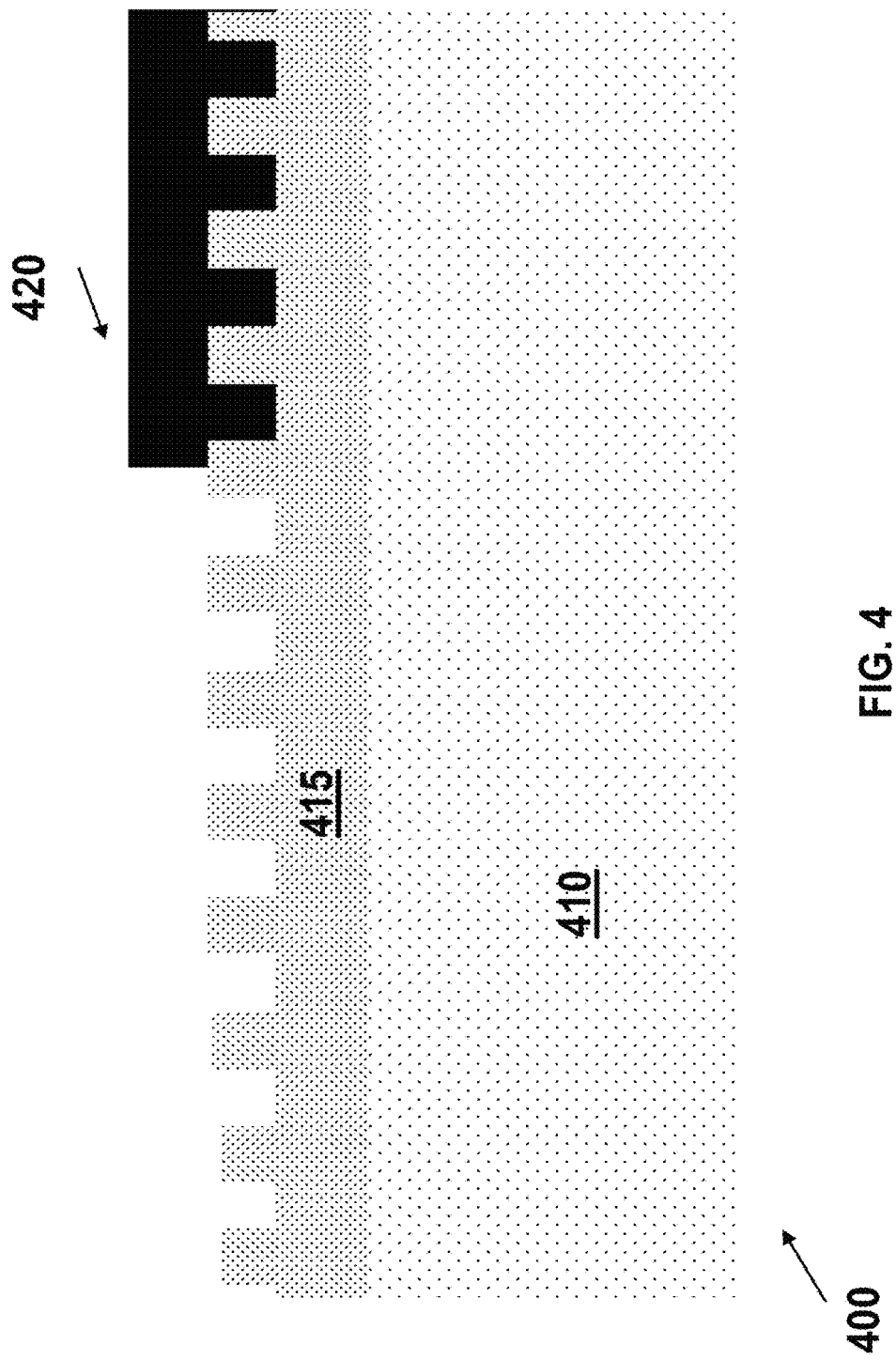
FIG. 4 depicts a schematic of a screen printed solar cell.

FIG. 4 depicts a schematic of a screen printed solar cell 400. The screen printed solar cell 400 includes a substrate 410, an array of nanowires 415 and a plurality of screen printed contacts 420.

APPLICATIONS

Processes and device designs of the invention may be applied to contacting silicon nanowire arrays for optoelectronic devices. They may be employed in devices that utilize the photoelectric or photovoltaic effect, for example solar cells, photodetectors, photodiodes, phototransistors, photomultipliers and integrated optical circuits.

Processes and designs of the invention may be employed to produce devices made out of or comprising polycrystalline silicon. The invention encompasses processes and designs, which can be used with any crystalline orientation of silicon including polysilicon. Polysilicon is a cheaper material than crystalline silicon, but it is typically more difficult to texture and structure than single crystal silicon due to the random orientation of the grains. The processes and design of the invention can likewise be used to contact nanowires in amorphous silicon.

Arrays of silicon nanowires can be used in applications where the silicon will he subjected to stress or strain where the nanostructure is able to absorb and relax this stress or strain. For example, nanowires can act as an interfacial layer between hulk silicon and another material grown on top, which is not lattice-matched to it.

Processes described in this application are also applicable to lithium ion battery technology. Silicon has been seen as a desirable candidate for the anode material in lithium ion batteries due to its low discharge potential and high charge capacity. Its application in the past has been limited due to the large change in volume associated with ion insertion and ion extraction. The large amounts of stress and strain that builds in the silicon results in degradation of the silicon layer resulting in a very short performance lifetime. Nanowires have been pursued due to their ability to withstand these stress and strains. The fact that porous silicon (nanopores or micropores) can also he contacted via processes described in this application would enable the fabrication of another anode geometry capable of withstanding the stresses and strains of ion insertion/extraction for lithium ion battery applications.

Processes and designs described in this application may be used to contact nanostructures, which make silicon into an intermediate band photovoltaic material (IBPV). Silicon has an excellent band structure for IBPV, provided that the strength of particular electronic transitions can be enhanced. One way to do this is to form a dense array of silicon nanowires with specific control over the wire diameter, doping and crystallographic orientation. Processes and designs described in this application may be used for contacting such nanowire arrays.

Processes and designs described in this application may be used to contact nanostructures formed for the purpose of being able to make electrical contact via the processes and designs of this application.

The following references may he relevant to this application: (1) I. Tobias, C. del Canizo, J. Alonso, "Crystalline silicon solar cells and modules," Chapter 7 in A. Luque, *Handbook of Photovoltiac Science and Engineering* (John Wiley & Sons 2003). (2) Sami Franssila, *Introduction to Microfabrication* (2d ed. John Wiley & Sons 2010). (3) K. Kang, W. Cai, "Size and temperature effects on the fracture mechanisms of silicon nanowires: Molecular dynamics simulations," *International Journal of Plasticity* 26, 1387-1401 (2010). (4) B. A. Cozen and O. B. Ozdoganlar, "A Rotating-Tip-Based Mechanical Nano-Manufacturing Process: Nanomilling," *Nanoscale Research Letters* 5, 1403-1407 (2010). (5) M. M. Hilali, A. Rohatgi, and B. To, "A Review and Understanding of Screen-Printed Contacts and Selective-Emitter Formation," 14$^{th}$ Workshop on Crystalline Silicon Solar Cells and Modules, Winter Park, Colo., Aug. 8-11, 2004. (6) Marcie Black, Joanne Forzitai, Michael Jura, Jeff Miller, and Brian Murphy, "Electrical Contacts to Nanostructured Areas", provisional patent application No. 61/536,243. attorney docket number 161565-0053, filed on Sep. 19, 2011.

All patents, patent applications, and publications mentioned in this application are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A silicon nanostructured device comprising:
   a non-nanostructured substrate;
   a nanostructured area disposed on and contacting a surface of the substrate;
   a passivating layer coating the nanostructured area, the passivating layer comprising one of aluminum oxide, silicon dioxide, or silicon nitride;
   a first contact comprising a comb-like pattern of metal directly contacting the nanostructured area;
   a p-n junction below the nanostructured area; and
   a second metal contact in electrical contact with the substrate.

2. The silicon nanostructured device of claim 1, wherein the device is configured to be suitable for use as a solar cell.

3. The silicon nanostructured device of claim 1, wherein the passivating layer coating the nanostructured area comprises silicon nitride.

4. The silicon nanostructured device of claim 1, wherein lengths of nanostructures in the nanostructured area are between about 150 nm and about 400 nm.

5. The silicon nanostructured device of claim 4, wherein the nanostructures in the nanostructured area have cross-sectional diameters between about 30 nm and about 200 nm.

6. The silicon nanostructured device of claim 1, wherein one third to one half of a volume of the nanostructured area is silicon.

7. The silicon nanostructured device of claim 1, wherein nanostructures in the nanostructured areas are tapered such that bases of the nanostructures on average have larger diameters than tips of the nanostructures.

8. The silicon nanostructured device of claim 1, wherein the non-nanostructured substrate consists of polycrystalline silicon.

9. The silicon nanostructured device of claim 1, wherein one of the first contact or the second contact comprises silver.

10. The silicon nanostructured device of claim 9, wherein the second metal contact comprises aluminum.

11. A silicon nanostructured device comprising:
    a non-nanostructured substrate;
    a nanostructured area disposed on and contacting a surface of the substrate;
    a passivating layer coating on the nanostructured area, the passivating layer comprising one of aluminum oxide, silicon dioxide, or silicon nitride;
    a first contact comprising a comb-like pattern of metal directly contacting the nanostructured area;
    a second contact in electrical contact with the substrate; and
    a p-n junction below the nanostructured area.

12. The silicon nanostructured device of claim 11, wherein at least one of the first contact or the second contact is fired at high temperature.

13. The silicon nanostructured device of claim 12, wherein the high temperature is in a range of about 700° C. to about 900° C.

14. The silicon nanostructured device of claim 13, wherein the high temperature is in a range of about 775° C. to about 825° C.

15. The silicon nanostructured device of claim 12, wherein the device is heat dried before firing at high temperature.

16. The silicon nanostructured device of claim 15, wherein the device is heat dried at a temperature in a range of about 100° C. to about 200° C. before firing at high temperature.

17. The silicon nanostructured device of claim 11, wherein the non-nanostructured substrate comprises n-type silicon.

18. The silicon nanostructured device of claim 11, wherein the non-nanostructured substrate comprises silicon having a resistivity of around 1 ohm-cm.

19. The silicon nanostructured device of claim 18, wherein the non-nanostructured substrate comprises n-type silicon.

20. The silicon nanostructured device of claim 19, wherein the non-nanostructured substrate has a (100) crystallographic orientation.

* * * * *

UNITED STATES PATENT AND TRADEMARK OFFICE
CERTIFICATE OF CORRECTION

PATENT NO. : 10,269,995 B2  
APPLICATION NO. : 15/622422  
DATED : April 23, 2019  
INVENTOR(S) : Michael Jura et al.

Page 1 of 1

It is certified that error appears in the above-identified patent and that said Letters Patent is hereby corrected as shown below:

In the Specification

Column 1, Line 41, insert -- *to* -- between "*Introduction*" and "*Microfabrication*".
Column 2, Line 53, delete "leaving" and insert -- having --.
Column 3, Line 10, delete "in" and insert -- In --.
Column 4, Line 34, insert -- silicon -- between "N-type" and "material".
Column 5, Line 24, delete "2." and insert -- 2 --.
Column 5, Line 39, delete "Fiimtronics" and insert -- Filmtronics --.
Column 6, Line 3, delete "AID" and insert -- ALD --.
Column 6, Line 7, delete "AID" and insert -- ALD --.
Column 6, Line 19, delete "nano wires" and insert -- nanowires --.
Column 7, Line 10, delete "he" and insert -- be --.
Column 7, Line 13, delete "hulk" and insert -- bulk --.
Column 7, Line 26, delete "he" and insert -- be --.
Column 7, Line 45, delete "he" and insert -- be --.
Column 7, Line 54, delete "Cozen" and insert -- Gozen --.

Signed and Sealed this  
Eighteenth Day of June, 2019

Andrei Iancu  
*Director of the United States Patent and Trademark Office*